(12) United States Patent
Hosoya et al.

(10) Patent No.: US 11,955,342 B2
(45) Date of Patent: Apr. 9, 2024

(54) METHOD OF ETCHING AND APPARATUS FOR PLASMA PROCESSING

(71) Applicant: Tokyo Electron Limited, Tokyo (JP)

(72) Inventors: Masanori Hosoya, Miyagi (JP); Tangkuei Wang, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 55 days.

(21) Appl. No.: 17/199,659

(22) Filed: Mar. 12, 2021

(65) Prior Publication Data

US 2021/0296134 A1    Sep. 23, 2021

(30) Foreign Application Priority Data

Mar. 19, 2020   (JP) ................................ 2020-049509

(51) Int. Cl.
| | | |
|---|---|---|
| *H01L 21/00* | (2006.01) | |
| *H01J 37/04* | (2006.01) | |
| *H01J 37/32* | (2006.01) | |
| *H01L 21/02* | (2006.01) | |
| *H01L 21/311* | (2006.01) | |

(52) U.S. Cl.
CPC ........ *H01L 21/31116* (2013.01); *H01J 37/04* (2013.01); *H01J 37/32091* (2013.01); *H01J 37/32183* (2013.01); *H01J 37/3244* (2013.01); *H01L 21/02164* (2013.01); *H01L 21/0217* (2013.01); *H01L 21/02263* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 10,755,944 B2* | 8/2020 | Tabata | H01J 37/32568 |
| 2008/0188082 A1* | 8/2008 | Chi | H01L 21/31138 |
| | | | 257/E21.252 |
| 2016/0351407 A1* | 12/2016 | Sawataishi | H01L 21/6831 |
| 2019/0139780 A1* | 5/2019 | Iwano | H01L 21/31144 |

FOREIGN PATENT DOCUMENTS

| | | | | |
|---|---|---|---|---|
| EP | 2911187 A1 * | 8/2015 | | C23C 2/006 |
| JP | 2015-173240 A | 10/2015 | | |
| JP | 2016-111177 A | 6/2016 | | |
| JP | 2018-157048 A | 10/2018 | | |

* cited by examiner

*Primary Examiner* — Parviz Hassanzadeh
*Assistant Examiner* — Michelle Crowell
(74) *Attorney, Agent, or Firm* — Pearne & Gordon LLP

(57) ABSTRACT

A method of an etching includes preparing a substrate having a first region formed of silicon oxide and a second region formed of silicon nitride; etching the first region by exposing the substrate to plasma of a first processing gas including a fluorocarbon gas, and forming a deposit including fluorocarbon on the first region and the second region; etching the first region and the second region by radicals of the fluorocarbon included in the deposit; and removing the deposit by plasma of a second processing gas which does not include oxygen.

7 Claims, 8 Drawing Sheets

FIG. 7A  FIG. 7B  FIG. 7C
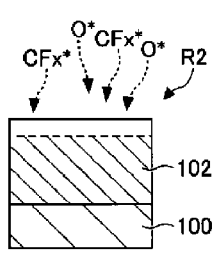 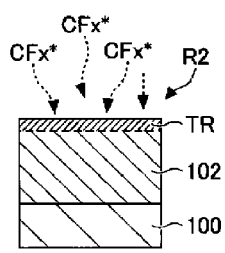 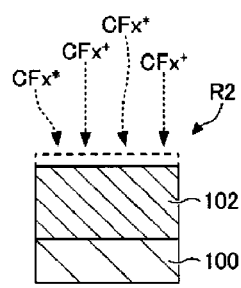
FIG. 8
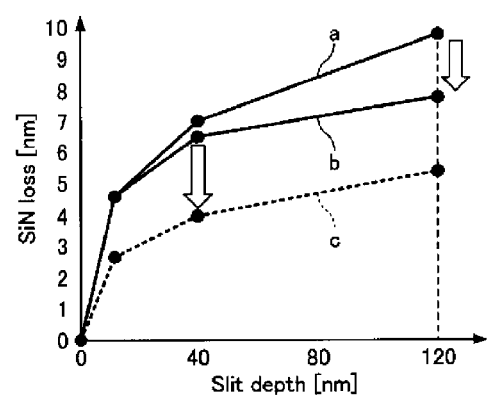

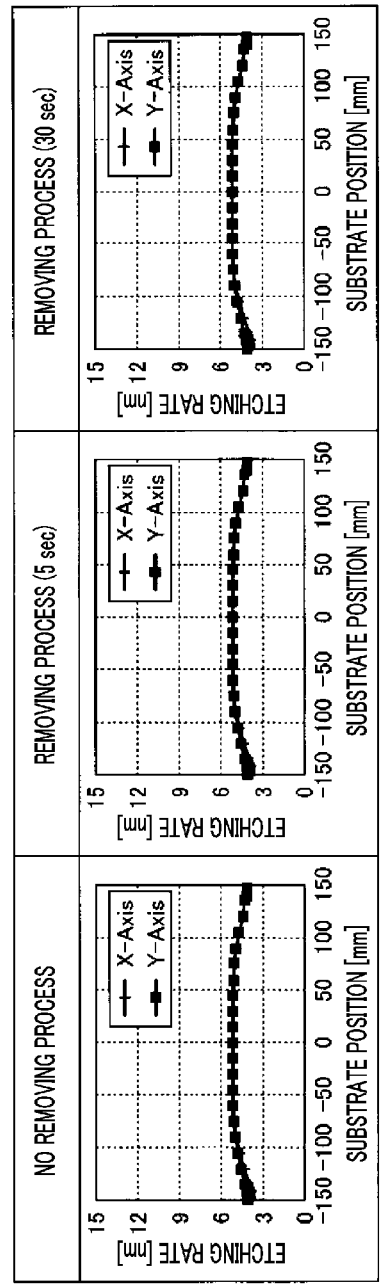

METHOD OF ETCHING AND APPARATUS FOR PLASMA PROCESSING

CROSS-REFERENCE TO RELATED APPLICATION

This application claims the benefit of Japanese Patent Application No. 2020-049509 filed on Mar. 19, 2020, the entire disclosure of which is incorporated herein by reference.

TECHNICAL FIELD

The various aspects and embodiments described herein pertain generally to a method of an etching and an apparatus for a plasma processing.

BACKGROUND

Patent Document 1, for example, proposes etching silicon oxide selectively against silicon nitride on a substrate having a film of the silicon oxide and a film of the silicon nitride.
Patent Document 1: Japanese Patent Laid-open Publication No. 2015-173240

SUMMARY

In one exemplary embodiment, a method of an etching includes preparing a substrate having a first region formed of silicon oxide and a second region formed of silicon nitride; etching the first region by exposing the substrate to plasma of a first processing gas including a fluorocarbon gas, and forming a deposit including fluorocarbon on the first region and the second region; etching the first region and the second region by radicals of the fluorocarbon included in the deposit; and removing the deposit by plasma of a second processing gas which does not include oxygen.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 7A to FIG. 7C are diagrams for describing a state of the second region;

FIG. 8 is a diagram illustrating a loss of silicon nitride in a removing process;

FIG. 11A to FIG. 11C are diagrams showing a relationship between a processing time of the removing process and an etching rate of silicon oxide.

DETAILED DESCRIPTION

Figure 1:
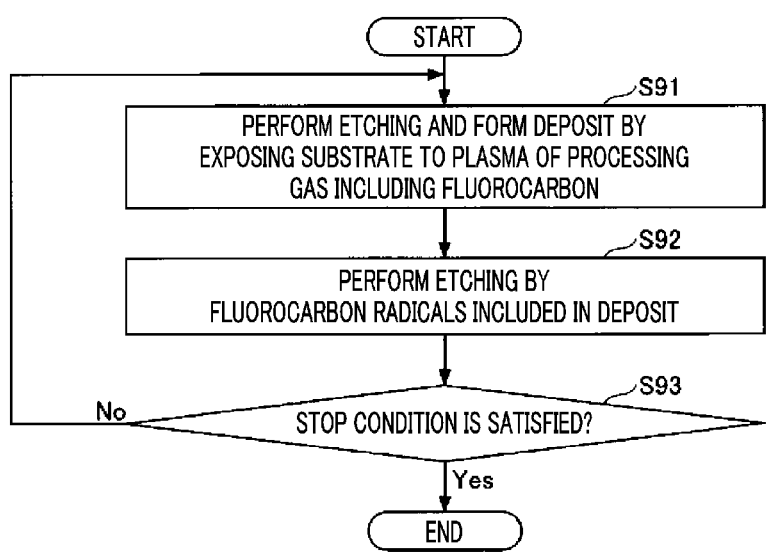
FIG. 1 is a flowchart illustrating an etching method according to a comparative example.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the various drawings, same parts will be assigned same reference numerals, and redundant description thereof will be omitted.

Before starting explanation of an etching method according to an exemplary embodiment, an etching method according to a comparative example will be first described briefly. FIG. 1 is a flowchart illustrating the etching method according to the comparative example. The etching method shown in FIG. 1 includes a process S91 and a process S92, and these processes S91 and S92 are repeated alternately.

To be specific, in the process S91, a substrate W is exposed to plasma of a processing gas including a fluorocarbon gas. The fluorocarbon gas includes at least one of, for example, a $C_4F_6$ gas or a $C_4F_8$ gas. Further, this processing gas may include at least one of various kinds of rare gases such as an Ar gas and a He gas. Furthermore, this processing gas may also include an oxygen ($O_2$) gas. In the process S91, the plasma is formed as the processing gas is excited, and the substrate W is exposed to the formed plasma. Active species of atoms and/or molecules originated from fluorocarbon, for example, active species of fluorine and/or fluorocarbon collide against the substrate W. As a result, a first region is etched in the process S91. Further, in this process S91, a deposit including the fluorocarbon adheres to the first region to be deposited thereon.

Subsequently, in the process S92, the substrate W after being subjected to the processing of the process S91 is exposed to plasma of the rare gas, and the first region is etched by radicals of the fluorocarbon included in the deposit. In the process S92, active species of atoms of the rare gas, for example, ions of the atoms of the rare gas collide against the deposit. Accordingly, the fluorocarbon radicals in the deposit cause the first region R1 to be etched. Further, by the process S92, a film thickness of the deposit is reduced. Further, in the process S92, a film thickness of the deposit on a second region is also reduced. Since, however, a modified region formed in the processing of the process S91 exists on the second region, etching of the second region is suppressed.

Then, in a process S93, it is determined as an example of a stop condition whether a repetition number of a cycle including the processes S91 and S92 has reached a predetermined number of times. If the stop condition is not satisfied, the processes S91 and S92 are repeated again. If the stop condition is met, on the other hand, the present processing is ended.

In the present processing, to protect the second region made of silicon nitride, a flow rate of the $C_4F_6$ gas or the like is increased to increase the deposit on the second region so that the silicon nitride is protected by the deposit. If, however, a carbon amount in the gas is increased excessively, the first region made of silicon oxide may not be etched. As a countermeasure, a method of removing the deposit with plasma of a gas including an oxygen ($O_2$) gas may be considered. In this method, however, the silicon nitride might be degraded as a result of being oxidized or the like.

[Etching Method]

Figure 2:
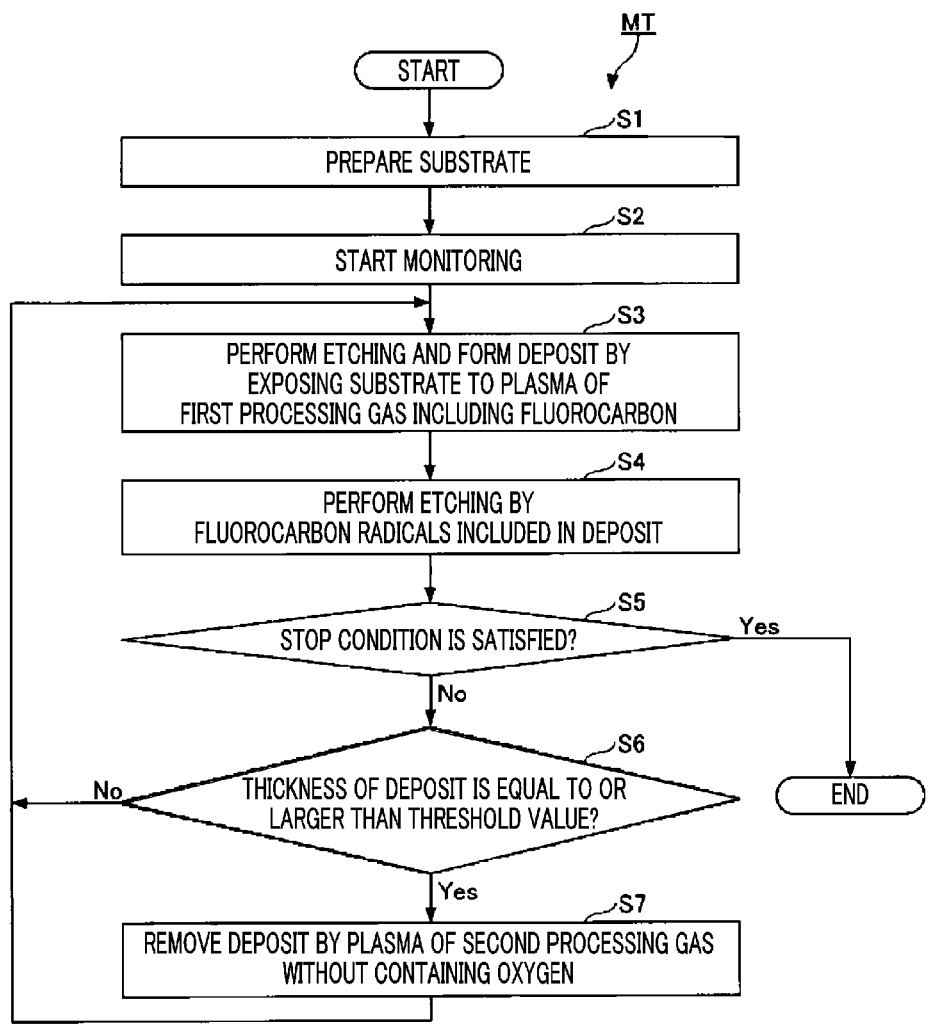
FIG. 2 is a flowchart illustrating an etching method MT according to an exemplary embodiment.
Figure 3:
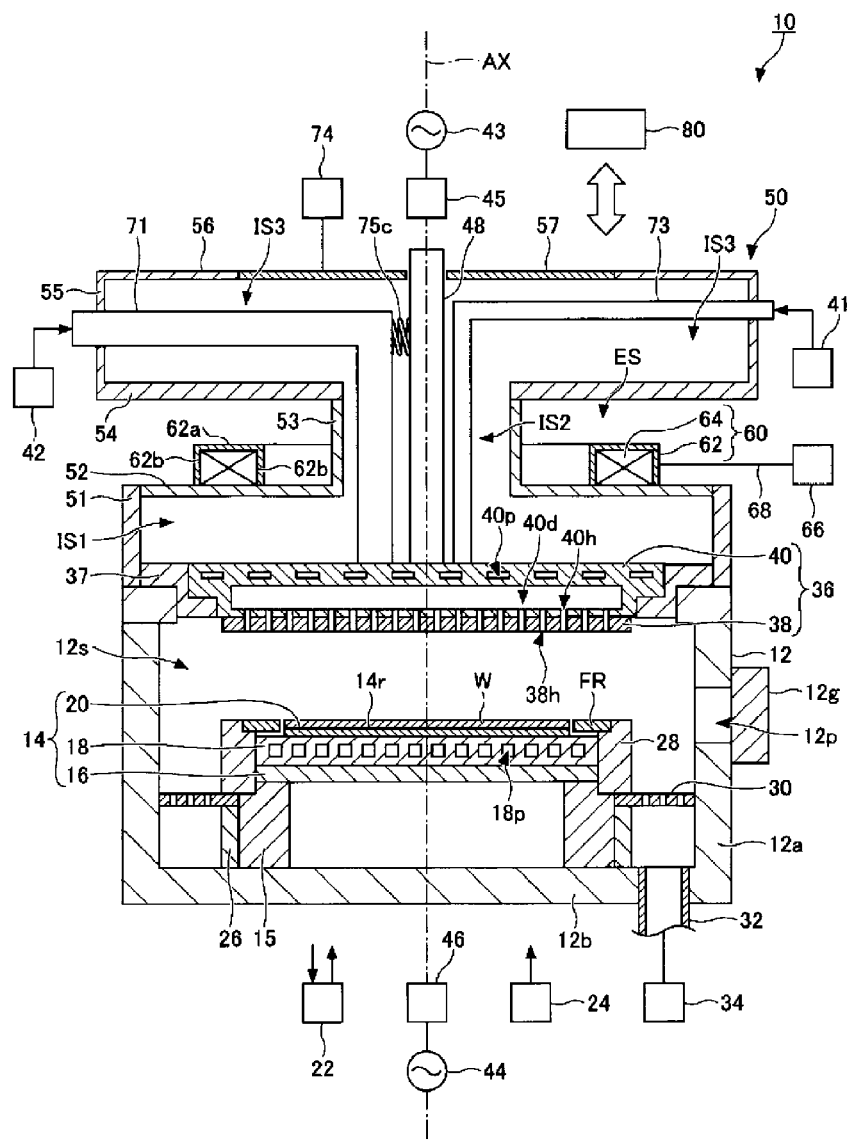
FIG. 3 is a cross sectional schematic diagram illustrating a plasma processing apparatus according to the exemplary embodiment.

In view of the foregoing problems, a method of etching the silicon oxide while suppressing degradation of the silicon nitride will be proposed in an exemplary embodiment to be described below. FIG. 2 is a flowchart illustrating an etching method according to the exemplary embodiment. FIG. 3 is a cross sectional schematic diagram illustrating a plasma processing apparatus 10 according to the exemplary embodiment. FIG. 3 illustrates an example of the plasma processing apparatus 10 according to the exemplary embodiment, which can be applied to the etching method (hereinafter, referred to as "method MT") shown in FIG. 2.

Figure 4:
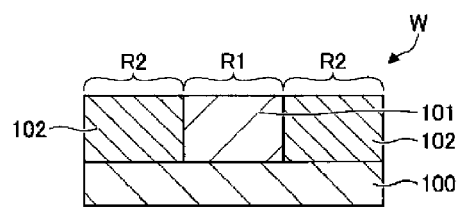
FIG. 4 is a cross sectional view illustrating an example etching target film of the method MT.

FIG. 4 is a cross sectional view illustrating an example of an etching target film of the method MT. The substrate W has a base layer 100, a first region R1 and a second region R2. The base layer 100 may be made of, for example, polycrystalline silicon. The first region R1 is made of a silicon oxide 101. The second region R2 is made of a silicon nitride 102.

The substrate W having the film of this structure is prepared, and transferred into a chamber 12 of the plasma processing apparatus 10 of FIG. 3 and placed on a placing table 14. The plasma processing apparatus 10 performs etching by the method MT. The method MT is performed to etch the first region R1 of the substrate W selectively against the second regions R2 thereof.

Below, the description will be provided for an example where the method MT is applied to the substrate W having the etching target film shown in FIG. 4. In the method MT, the plasma processing apparatus 10 is used. In FIG. 3, the plasma processing apparatus 10 according to the exemplary embodiment is illustrated in a partially cutaway state on a vertically extending plane.

The plasma processing apparatus 10 shown in FIG. 3 is equipped with the chamber 12. The chamber 12 has a substantially cylindrical shape and includes a sidewall 12a and a bottom 12b. The chamber 12 provides an internal space 12s. A central axis AX shown in FIG. 3 is a central axis of the chamber 12 and the internal space 12s. The chamber 12 is made of a metal such as, but not limited to, aluminum.

A plasma-resistant film is formed on an inner wall surface of the chamber 12. This film may be a ceramic film such as an alumite film or an yttrium oxide film. The chamber 12 is grounded.

A passage 12p is formed at the sidewall 12a. The substrate W passes through the passage 12p when it is transferred between the internal space 12s and an outside of the chamber 12. The substrate W may have a substantially disk shape. The passage 12p is opened or closed by a gate valve 12g. The gate valve 12g is provided along the sidewall 12a.

The placing table 14 is provided in the internal space 12s. The placing table 14 is supported by a support 15. The support 15 has a substantially cylindrical shape, and is extended upwards from the bottom 12b of the chamber 12. The support 15 has insulation property and is made of, for example, ceramic.

The placing table 14 is configured to support the substrate W. The placing table 14 shares the central axis AX with the chamber 12. The placing table 14 provides a placing region 14r. A center of this placing region 14r lies on the central axis AX. The substrate W is placed on the placing region 14r such that a center thereof lies on the central axis AX.

The placing table 14 includes an electrode plate 16, a lower electrode 18 and an electrostatic chuck 20. The electrode plate 16 has a substantially disk shape. The electrode plate 16 has conductivity. The electrode plate 16 is formed of a metal such as aluminum. The lower electrode 18 has a substantially disk shape. The lower electrode 18 has conductivity. The lower electrode 18 is formed of a metal such as aluminum. The lower electrode 18 is placed on the electrode plate 16. The lower electrode 18 is electrically connected to the electrode plate 16. The placing table 14 including the lower electrode 18 is an example of a first electrode configured to place the substrate thereon within the chamber 12.

A flow path 18p is formed inside the lower electrode 18. The flow path 18p extends, for example, in a spiral shape inside the lower electrode 18. A heat exchange medium (for example, a temperature control medium) is supplied into the flow path 18p from a circulation device 22 (for example, a chiller unit) for circulating the heat exchange medium. The circulation device 22 is provided outside the chamber 12. The heat exchange medium supplied into the flow path 18p is returned to the circulation device 22. A temperature of the substrate W placed on the placing table 14 is controlled by heat exchange between the heat exchange medium and the lower electrode 18.

The electrostatic chuck 20 is provided on the lower electrode 18. The electrostatic chuck 20 has a substantially disk shape. The electrostatic chuck 20 has a main body made of a ceramic material; and a film-shaped electrode embedded therein. A DC power supply 24 is connected to the electrode of the electrostatic chuck 20 via a switch. The electrostatic chuck 20 provides the above-described placing region 14r. When a DC voltage from the DC power supply 24 is applied to the electrode of the electrostatic chuck 20 while the substrate W is placed on the electrostatic chuck 20 (on the placing region 14r), an electrostatic attraction force is generated between the substrate W and the electrostatic chuck 20. The substrate W is attracted to the electrostatic chuck 20 by the generated electrostatic attraction force to be held by the electrostatic chuck 20. The plasma processing apparatus 10 may be provided with a heat transfer gas supply line for supplying a heat transfer gas (for example, He gas) between the electrostatic chuck 20 and a rear surface of the substrate W. Further, a heater (for example, a resistance heating element) may be provided within the electrostatic chuck 20.

As a power is supplied to the heater, the heater generates heat, so that a temperature of the electrostatic chuck 20 and, ultimately, the temperature of the substrate W are adjusted.

Within the internal space 12s of the chamber 12, an edge ring FR is placed to surround the electrostatic chuck 20 and an edge of the substrate W. The edge ring FR is an annular plate formed of a silicon-containing material such as silicon or quartz. The edge ring FR is used to improve uniformity of a plasma processing, and is also referred to as a focus ring.

A cylindrical conductor 26 is provided around the support 15. The conductor 26 is grounded. A cylindrical insulator 28 is provided above the conductor 26 so as to surround the placing table 14. The insulator 28 is formed of ceramic such as quartz. An exhaust path is formed between the placing table 14 and the sidewall 12a of the chamber 12. A baffle plate 30 is provided in the exhaust path. The baffle plate 30 is an annular plate. The baffle plate 30 has a plurality of holes penetrating the baffle plate 30 in a thickness direction thereof. The baffle plate 30 is formed by forming a plasma-resistant film such as yttrium oxide on a surface of a base member formed of a metal such as aluminum.

Below the baffle plate 30, an exhaust pipe 32 is connected to the bottom 12b of the chamber 12. The exhaust pipe 32 can communicate with the exhaust path. An exhaust device 34 is connected to the exhaust pipe 32. The exhaust device 34 includes an automatic pressure control valve and a decompression pump such as a turbo molecular pump. By operating the exhaust device 34, the pressure of the internal space 12s is set to a specified pressure.

An upper electrode 36 is provided above the placing table 14. A part of the internal space 12s is interposed between the upper electrode 36 and the placing table 14. The upper electrode 36 is provided to close an upper opening of the chamber 12. A member 37 is interposed between the upper electrode 36 and an upper end of the chamber 12. The member 37 is formed of an insulating material. The member 37 may be formed of ceramic, for example, quartz. In the exemplary embodiment, the member 37 and a part of a ground conductor 50 may be interposed between the upper electrode 36 and the upper end of the chamber 12.

In the exemplary embodiment, the upper electrode 36 constitutes a shower head. The upper electrode 36 is an example of a second electrode facing the first electrode configured to place the substrate thereon. The upper electrode 36 includes a top plate 38 and a ceiling supporting body 40 in the exemplary embodiment. The top plate 38 is formed of, for example, silicon. Alternatively, the top plate 38 is formed by providing a coating film formed of ceramic such as yttrium oxide on a surface of a base member formed of aluminum. The top plate 38 has a plurality of gas discharge openings 38h penetrating the top plate 38 in a thickness direction thereof.

The ceiling supporting body 40 is provided on the top plate 38. The ceiling supporting body 40 is configured to support the top plate 38 in a detachable manner. The ceiling supporting body 40 is formed of a conductive material such as aluminum. A gas diffusion space 40d is formed inside the ceiling supporting body 40. The ceiling supporting body 40 has a plurality of holes 40h extending downwards from the gas diffusion space 40d. Each of the plurality of holes 40h communicates with corresponding one of the plurality of gas discharge openings 38h.

A gas supply 41 is connected to the gas diffusion space 40d. The gas supply 41 is configured to supply a gas into the internal space 12s. The gas supply 41 is configured to output a plurality of gases for use in the method MT. Further, the gas supply 41 is equipped with a plurality of flow rate controllers and a plurality of valves, and configured to adjust flow rates of the gases to be output individually. The gas output from the gas supply 41 is discharged from the plurality of gas discharge openings 38h into the internal space 12s after passing through the gas diffusion space 40d and the plurality of holes 40h.

A flow path 40p is formed in the ceiling supporting body 40. A chiller unit 42 is connected to the flow path 40p. A temperature control medium such as cooling water is circulated between the flow path 40p and the chiller unit 42. The temperature of the upper electrode 36 is adjusted by heat exchange between the upper electrode 36 and the temperature control medium supplied into the flow path 40p from the chiller unit 42.

The plasma processing apparatus 10 further includes a first high frequency power supply 43 and a second high frequency power supply 44. The first high frequency power supply 43 and the second high frequency power supply 44 are provided outside the chamber 12. The first high frequency power supply 43 is configured to generate a first high frequency power mainly for plasma formation. The first high frequency power for plasma formation may have a frequency of, e.g., 60 MHz, but not limited thereto. The first high frequency power supply 43 is electrically connected to the upper electrode 36 via a matching unit 45 and a power feed conductor 48. The matching unit 45 has a matching circuit for matching an output impedance of the first high frequency power supply 43 with an impedance on a load side (on the upper electrode 36 side). A lower end of the power feed conductor 48 is connected to the upper electrode 36. The power feed conductor 48 extends upwards from the upper electrode 36. The power feed conductor 48 is a cylindrical or rod-shaped conductor, and its central axis substantially coincides with the central axis AX.

The second high frequency power supply 44 is configured to generate a high frequency bias power mainly for ion attraction into the substrate W. This high frequency bias power, that is, a second high frequency power has a frequency lower than the frequency of the first high frequency power. In the exemplary embodiment, the frequency of the second high frequency power may be equal to or larger than 40 MHz. The second high frequency power supply 44 is electrically connected to the lower electrode 18 via a matching unit 46. The matching unit 46 has a matching circuit for matching an output impedance of the second high frequency power supply 44 with an impedance on a load side (on the lower electrode 18 side).

Further, the first high frequency power supply 43 may be configured to apply the high frequency power to the lower electrode 18 instead of the upper electrode 36. Both the first high frequency power supply 43 and the second high frequency power supply 44 may serve as a plasma forming unit which supplies the high frequency power for plasma formation.

The plasma processing apparatus 10 further includes the ground conductor 50. The ground conductor 50 has conductivity. The ground conductor 50 is formed of a metal such as aluminum. The ground conductor 50 is grounded. The ground conductor 50 extends to cover the upper electrode 36 above the chamber 12. The power feed conductor 48 extends upwards through a space surrounded by the ground conductor 50 up to an outside of the ground conductor 50, and is connected to the first high frequency power supply 43 via the matching unit 45 at the outside the ground conductor 50.

In the internal space 12s of the chamber 12 of the plasma processing apparatus 10, electric field intensity distribution in which an electric field intensity is high above the center of the substrate W and low above the edge side of the substrate W is generated. That is, the non-uniform electric field intensity distribution in which the electric field intensity decreases as the distance from the central axis AX in a radial direction (i.e., diametrical direction) increases may be formed in the internal space 12s. Under such a non-uniform electric field intensity distribution, the plasma density is high near the central axis and low at a position far from the central axis. That is, the plasma density is non-uniformly distributed in the radial direction with respect to the central axis. The plasma processing apparatus 10 further includes an electromagnet 60 to obtain uniform plasma density distribution.

The electromagnet 60 is placed above the upper electrode 36. The electromagnet 60 forms magnetic field distribution, in which a horizontal component at a position far from the central axis AX is larger than a horizontal component on the central axis AX, in the internal space 12s of the chamber 12. That is, the electromagnet 60 forms, in the internal space 12s, the magnetic field distribution in which the horizontal component increases in magnitude as the distance from the central axis AX in the radial direction increases. At a position where a magnetic field having a large horizontal component is formed, a residence time of electrons increases. As a result, the plasma density increases at the position where the magnetic field having a large horizontal component is formed. Therefore, according to the plasma processing apparatus 10, uniform plasma density distribution can be obtained in the radial direction with respect to the central axis AX. Therefore, according to the plasma processing apparatus 10, the in-plane uniformity in processing of the substrate W is improved.

In the exemplary embodiment, the electromagnet 60 has a yoke 62 and a coil 64. The yoke 62 is formed of a magnetic material. The yoke 62 has a base portion 62a and a plurality of cylindrical portions 62b. The base portion 62a has a substantially disk shape, and extends in a direction orthogonal to the central axis AX. Each of the plurality of cylindrical portions 62b has a cylindrical shape, and extends downwards from the base portion 62a. The plurality of cylindrical portions 62b is provided coaxially around the center axis AX. The coil 64 is wound around the central axis AX. The coil 64 is provided between two cylindrical portions 62b that are adjacent in the diametrical direction. Also, the electromagnet 60 may have one or more coils 64. When the electromagnet 60 has a plurality of coils 64, the plurality of coils 64 is provided coaxially around the central axis AX.

The coil 64 of the electromagnet 60 is connected to a current source 66 through a wiring 68. When a current from the current source 66 is applied to the coil 64, a magnetic field is formed by the electromagnet 60. At a position where the angle of a vector of the magnetic field formed by the electromagnet 60 is 45°, an electron confinement effect (effect of suppressing diffusion of electrons) in the radial direction (diametrical direction) and an electron extinction suppressing effect (effect of suppressing electrons from reaching the electrode) are well compatible with each other. Therefore, at that position, the plasma density increases. Accordingly, if the radius of the substrate W is, for example, 150 mm, the electromagnet 60 may be configured such that the distance between the position where the angle of the vector of the magnetic field is 45° and the central axis AX is 135 mm or more and 185 mm or less.

The electromagnet 60 is disposed at an outside of the ground conductor 50. The ground conductor 50 provides an external space ES in which the electromagnet 60 is placed. The external space ES is closer to the internal space 12s than the upper end of the ground conductor 50, spaced upwards from the upper electrode 36 and shielded from the upper electrode 36 by the ground conductor 50.

The ground conductor 50 includes a first portion 51, a second portion 52 and a third portion 53. The first portion 51 has a cylindrical shape. A central axis of the first portion 51 substantially coincides with the central axis AX. The first portion 51 extends upwards from the chamber 12. In the example shown in FIG. 3, the first portion 51 extends upwards from an upper end of the side wall 12a of the chamber 12. A lower end of the first portion 51 is interposed between the member 37 and the upper end of the side wall 12a.

The second portion 52 is spaced upwards from the upper electrode 36 and extends from the first portion 51 toward the central axis AX. The second portion 52 has a plate shape extending in a direction intersecting with or orthogonal to the central axis AX. The first portion 51 and the second portion 52 provide a first space IS1 above the upper electrode 36. The first space IS1 is a part of a space inside the ground conductor 50 (i.e., on the upper electrode 36 side). Due to the first space IS1, a vertical distance between the upper electrode 36 and the ground conductor 50 is ensured. Therefore, capacitive coupling between the ground conductor 50 and the upper electrode 36 is suppressed.

The third portion 53 has a cylindrical shape. A central axis of the third portion 53 substantially coincides with the central axis AX. The third portion 53 extends at a position closer to the central axis than the first portion 51. The third portion 53 extends upwards from the second portion 52. The third portion 53 provides a second space IS2. The second space IS2 is a space inside the second portion 52 and is a part of the space inside the ground conductor 50 (i.e., on the upper electrode 36 side). The second space IS2 is continuous with the first space IS1. Also, the power feed conductor 48 extends upwards through the first space IS1 and the second space IS2.

The external space ES is provided by the ground conductor 50 outside the third portion 53, on the second portion 52 and above the internal space 12s. The external space ES extends at the outside of the third portion 53 and on the second portion 52 in a circumferential direction around the central axis AX. The electromagnet 60 is placed in the external space ES.

The distance between the electromagnet 60 placed in the external space ES and the internal space 12s is relatively short. Further, as described above, the electromagnet 60 forms the magnetic field distribution, in which the low horizontal component is located near the central axis AX and the large horizontal component is located at a position far from the central axis, in the internal space 12s. Therefore, the magnetic field distribution suitable for obtaining the uniform plasma density distribution can be efficiently formed in the internal space 12s by the electromagnet 60 placed outside the ground conductor 50.

The current source 66 is connected to the coil 64 of the electromagnet 60 as described above. The electromagnet 60 and the current source 66 are placed outside the ground conductor 50. Therefore, a filter configured to suppress introduction of a high frequency power into the current source 66 may not be provided between the coil 64 and the current source 66.

In the exemplary embodiment, the ground conductor 50 further includes a fourth portion 54, a fifth portion 55 and a sixth portion 56. The fourth portion 54 extends above the second portion 52 from the third portion 53 in the radial direction with respect to the central axis AX. The fourth portion 54 has a plate shape extending in the direction intersecting with or orthogonal to the central axis AX. The fifth portion 55 has a cylindrical shape. A central axis of the fifth portion 55 substantially coincides with the central axis AX. The fifth portion 55 is farther from the central axis than the third portion 53, and extends upwards from the fourth portion 54. The sixth portion 56 extends above the fourth portion 54 from the fifth portion 55 toward the central axis AX. The sixth portion 56 has a plate shape extending in the direction intersecting with or orthogonal to the central axis AX. In the exemplary embodiment, the ground conductor 50 further has a lid 57 extending from the sixth portion to the vicinity of the power feed conductor 48.

The fourth portion 54, the fifth portion 55 and the sixth portion 56 provide a third space IS3. The third space IS3 is a space surrounded by the fourth portion 54, the fifth portion 55 and the sixth portion 56 and is a part of the space inside the ground conductor 50. The third space IS3 is continuous with the second space IS2. The power feed conductor 48 extends upwards through the third space IS3. In the example shown in FIG. 3, the first to sixth portions are formed of three members, but the number of members forming the ground conductor 50 may vary.

The plasma processing apparatus 10 further includes a pipe 71. The pipe 71 extends upwards from the upper electrode 36 through the first space IS1 and the second space IS2, and extends laterally to the outside of the ground conductor 50 through the third space IS3. The pipe 71 is connected to the chiller unit 42 at the outside of the ground conductor 50. The temperature control medium from the chiller unit 42 is supplied into the flow path 40$p$ through the pipe 71. In the third space IS3, the pipe 71 is substantially shielded from the upper electrode 36 by the fourth portion 54 of the ground conductor 50.

In the exemplary embodiment, the plasma processing apparatus 10 further includes a pipe 73. The pipe 73 extends upwards from the upper electrode 36 through the first space IS1 and the second space IS2, and extends laterally to the outside of the ground conductor 50 through the third space IS3. The pipe 73 is connected to the gas supply 41 at the outside of the ground conductor 50. The gas output from the gas supply 41 is supplied to the upper electrode 36, i.e., the shower head, through the pipe 73. In the third space IS3, the pipe 73 is substantially shielded from the upper electrode 36 by the fourth portion 54 of the ground conductor 50. The gas supply 41 and the upper electrode 36 (i.e., the shower head) may be connected to each other via a plurality of pipes.

In the exemplary embodiment, the plasma processing apparatus 10 is further equipped with a DC power supply 74. The DC power supply 74 is configured to generate a negative DC voltage to be applied to the upper electrode 36. A wiring (not shown) connecting the DC power supply 74 and the upper electrode 36 may include a coil 75$c$. The coil 75$c$ is provided in the third space IS3. The wiring connecting the DC power supply 74 and the upper electrode 36 extends upwards from the upper electrode 36 through the first space IS1 and the second space IS2, and extends laterally to the outside of the ground conductor 50 through the third space IS3.

In the exemplary embodiment, the plasma processing apparatus 10 further includes a controller 80. The controller 80 is configured to control the components of the plasma processing apparatus 10. The controller 80 can be a computer device. The controller 80 may include a processor, a storage device such as a memory, an input device such as a keyboard, a mouse or a touch panel, a display device, a control signal input/output interface, and the like. The storage device stores a control program and recipe data. The processor of the controller 80 executes the control program and sends a control signal to control each component of the plasma processing apparatus 10 based on the recipe data. The controller 80 can control each component of the plasma processing apparatus 10 to perform the method MT according to the exemplary embodiment.

[Etching Method]

Now, the method MT that can be performed by the plasma processing apparatus 10 will be explained. When the method MT is performed, operations of the individual components of the plasma processing apparatus 10 can be controlled by the controller 80. In the method MT, in a process S1 of FIG. 2, the substrate W having the first region R1 and the second region R2 is prepared on the placing table 14. Then, in a process S2, monitoring of a surface state of the substrate W is begun. A byproduct generated by the etching in the method MT adheres to the first region R1 and the second region R2 as a deposit. In the process S2, a thickness of this deposit is monitored by the controller 80. This monitoring may be performed by using a measuring device configured to measure a thickness of the deposit by using reflection of light radiated to the substrate W. However, the way how to measure the thickness of the deposit is not limited thereto, and various other well-known methods may be employed.

In a subsequent process S3, a first processing gas including a fluorocarbon gas is supplied. The fluorocarbon gas includes at least one of, for example, a $C_4F_6$ gas or a $C_4F_8$ gas. Further, the first processing gas may include at least one of various kinds of rare gases such as an Ar gas and a He gas. Furthermore, this processing gas may also include an oxygen ($O_2$) gas. In the process S3, plasma is formed as the first processing gas is excited, and the substrate W is exposed to the formed plasma.

When the process S3 is performed by using the plasma processing apparatus 10, the first processing gas is supplied into the chamber 12 from the gas supply 41. Further, the high frequency power for plasma formation is supplied to the upper electrode 36 from the first high frequency power supply 43. Further, the high frequency bias power from the second high frequency power supply 44 may be supplied to the lower electrode 18. In addition, a pressure of a space within the chamber 12 is set to a preset pressure by the exhaust device 34. For example, the pressure of the space within the chamber 12 is set to be in a range from 10 mTorr (1.333 Pa) to 50 mTorr (6.666 Pa).

In the process S3, initially, active species of atoms and/or molecules originated from fluorocarbon, for example, active species of fluorine and/or fluorocarbon collide against the first region R1 of the substrate W shown in FIG. 4. As a result, in the process S3, the first region R1 is etched. Further, in the process S3, a deposit including the fluorocarbon adheres to the first region R1. Accordingly, a deposit DP including the fluorocarbon is formed on the first region R1. A film thickness of this deposit DP increases with a lapse of a processing time of the process S3.

Figures 5A, 5B, 5C, 5D:
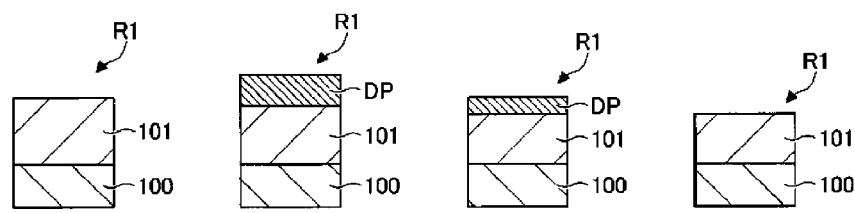
FIG. 5A to FIG. 5D are diagrams for describing etching of a first region by the method MT.

FIG. 5A to FIG. 5D are diagrams for describing the etching of the first region R1 by the method MT. FIG. 5A illustrates an initial state of the first region R1. From this initial state, the first region R1 is etched in the process S3 by the active species of the fluorocarbon in the plasma, and the deposit DP of the fluorocarbon is formed on the first region R1 by the active species of the fluorocarbon, as illustrated in FIG. 5B.

In the process S3, initially, the active species of the atoms and/or molecules originated from the fluorocarbon, for example, the active species of the fluorine and/or fluorocarbon also collide against the second region R2 of FIG. 4. FIG. 6A to FIG. 6D are diagrams for describing etching of the second region R2 by the method MT.

Figures 6A, 6B, 6C, 6D:
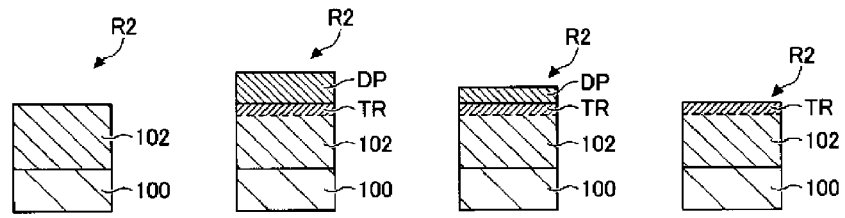
FIG. 6A to FIG. 6D are diagrams for describing etching of a second region by the method MT.

If these active species collide against the second region R2, a modified region TR modified from the deposit of the fluorocarbon and having a high carbon content ratio is formed on a surface of the second region R2, as illustrated in FIG. 6B, as compared to an initial state of FIG. 6A. Further, a deposit DP containing carbon and silicon is deposited thereon. The modified layer TR contains silicon and nitrogen forming the second region R2 and the atoms and/or molecules included in the processing gas, and serves to suppress the silicon nitride 102 from being etched. For example, the modified region TR may contain carbon, fluorine and oxygen included in the processing gas, in addition to the silicon and the nitrogen.

If the film thickness of the deposit DP formed by the processing of the process S3 increases, the active species capable of etching the first region R1 at the first region R1 is suppressed from being arrived by the deposit DP. Thus, if the process S3 is performed continuously, the etching of the first region R1 is stopped. To suppress this stop of the etching, a process S4 of FIG. 2 is subsequently performed in the method MT.

In the process S4, the first region R1 is etched by radicals of the fluorocarbon included in the deposit DP. In the process S4 according to the exemplary embodiment, the substrate W after being processed in the process S3 is exposed to plasma of a rare gas such as an Ar gas. An etching time of this process S4 and a processing time of the process S3 can be set as required. In the present exemplary embodiment, a ratio of the processing time of the process S3 to a sum of the processing time of the process S3 and the etching time of the process S4 is set to be in a range from 30% to 70%.

When the process S4 is performed by using the plasma processing apparatus 10, the rare gas such as the Ar gas is supplied from the gas supply 41. Further, in the process S4, an oxygen gas ($O_2$ gas) may or may not be supplied in addition to the rare gas. Furthermore, in the process S4, the high frequency power for plasma formation from the first high frequency power supply 43 may be supplied to the upper electrode 36, and the high frequency bias power from the second high frequency power supply 44 may be supplied to the lower electrode 18. The high frequency power for plasma formation output in the process S4 may be equal to or higher than the high frequency power for plasma formation output in the process S3. If the high frequency power in the process S4 is set to be higher than the high frequency power in the process S3, an ion flux can be increased.

Meanwhile, it is desirable to set the high frequency bias power output in the process S4 to be higher than the high frequency bias power output in the process S3. Accordingly, attraction of the ions in the plasma can be increased, so that an etching effect can be improved.

Further, in the process S4, the pressure of the space within the chamber 12 is set to the preset pressure by the exhaust device 34. By way of example, the pressure of the space within the chamber 12 may be set to range from 10 mTorr (1.3333 Pa) to 50 mTorr (6.666 Pa).

The plasma of the rare gas such as the Ar gas is formed within the chamber 12, and the substrate W placed on the placing table 14 is exposed to the plasma of the rare gas. In the process S4, active species of atoms of the rare gas, for example, ions of the atoms of the rare gas collide against the deposit DP. Accordingly, as illustrated in FIG. 5C, the radicals of the fluorocarbon in the deposit DP causes the first region R1 to be etched. Further, through the process S4, the film thickness of the deposit DP decreases. Moreover, in the process S4, the film thickness of the deposit DP on the second region R2 also decreases, as shown in FIG. 6C. Since, however, the modified region TR is formed on the second region R2, the etching of the second region R2 is suppressed. Accordingly, the first region R1 is selectively etched against the second region R2. Further, if the oxygen gas is not supplied in the process S4, the first region R1 can be etched more selectively against the second region R2.

Thereafter, in a process S5 of FIG. 2, it is determined as an example of a stop condition whether a repetition number of a cycle including the processes S3 and S4 has reached a preset number of times, and if the repetition number has reached the preset number of times, it is determined that the stop condition is met. If, however, the stop condition is not satisfied, a process S6 is performed. Meanwhile, if the stop condition is satisfied, the present processing is ended.

In the process S6, it is determined whether the film thickness of the deposit DP measured in the process S2 is equal to or larger than a threshold value. In the method MT, the film thickness of the deposit DP is measured in real time by monitoring the surface state of the substrate W. Accordingly, the deposit DP can be removed more effectively. If the film thickness of the deposit DP is equal to or larger than the threshold value in the process S6, a second processing gas without containing oxygen is supplied and the deposit DP is removed by plasma of this second processing gas in a process S7.

If the etching processings of the process S3 and the process S4 are performed repeatedly, the etching of the first region R1 may be stopped. Thus, if the film thickness of the deposit DP is equal to or larger than the threshold value, it is determined that there is a likelihood that the etching may be stopped, and the process S7 of removing the deposit DP by the plasma of the second processing gas without containing the oxygen is performed.

The second processing gas includes at least one of various kinds of fluorine-containing gases, or a nitrogen ($N_2$) gas. The fluorine-containing gas may be at least one of, for example, a tetrafluoromethane ($CF_4$) gas, a nitrogen trifluoride ($NF_3$) gas or a sulfur hexafluoride ($SF_6$) gas. A $C_xF_y$ gas cannot be used as the second processing gas. If the $C_xF_y$ gas is used, the deposit DP containing carbon may be deposited excessively.

Although the second processing gas may include at least one of various kinds of rare gases such as an argon (Ar) gas and a helium (He) gas, a hydrogen ($H_2$) gas cannot be used as the second processing gas. If the hydrogen gas is used, plasma of the hydrogen gas may penetrate a protection film to reach the silicon nitride 102, resulting in modification of the surface of the silicon nitride 102 and resultant deterioration of the silicon nitride 102.

The second processing gas does not include the oxygen ($O_2$) gas. The process S7 of removing the deposit DP (hereinafter, also referred to as "removing process") is performed when the film thickness of the deposit DP shown in FIG. 5C is equal to or larger than the threshold value, and, as a result, the deposit DP of the region R1 is removed, as illustrated in FIG. 5D. Accordingly, the stop of the etching of the first region R1 made of the silicon oxide 101 can be avoided.

In the removing process of the process S7 as described above, the silicon nitride 102 of the region R2 is exposed to the second processing gas while the deposit DP of the silicon oxide 101 is being removed. Here, if the oxygen gas is included in the second processing gas, the silicon nitride 102 may be oxidized, damaged and degraded.

FIG. 7A to FIG. 7C are diagrams for describing a state of the second region R2. FIG. 7A schematically illustrates a state of the second region R2 when the processing gas including the oxygen gas is supplied in the process of removing the deposit DP. In this case, radials (O*) of the oxygen gas as well as radicals ($CF_x$*) of fluorocarbon in the plasma are supplied, and a surface layer of the silicon nitride 102 is oxidized and degraded by the radials (O*) of the oxygen gas.

In view of this, in the method MT, the second processing gas does not include the oxygen gas. Accordingly, the oxidation of the silicon nitride 102 can be suppressed, as illustrated in FIG. 7B. As a result, in the process S7 in the method MT, the oxidation of the silicon nitride 102 can be suppressed as shown in FIG. 6D and FIG. 7B while the deposit DP of the silicon oxide 101 of the region R1 is removed as illustrated in FIG. 5D. Accordingly, the etching of the silicon oxide 101 of the first region R1 can be carried on without being stopped, while degradation of the silicon nitride 102 of the region R2 is suppressed.

When the process S7 is performed by using the plasma processing apparatus 10, the second processing gas is supplied into the chamber 12 from the gas supply 41. Further, the high frequency power for plasma formation is supplied to the upper electrode 36 from the first high frequency power supply 43. The first high frequency power supply 43 supplies the high frequency power having a frequency of, e.g., 60 MHz and a power level of, e.g., 100 W. Further, the pressure of the space within the chamber 12 is set to the preset pressure by the exhaust device 34. For example, the pressure of the space within the chamber 12 is set to range from 10 mTorr (1.333 Pa) to 50 mTorr (6.666 Pa).

When the process S7 is performed, if the high frequency bias power from the second high frequency power supply 44 is applied to the lower electrode 18, ions ($CF_x^+$) of the fluorocarbon as well as the radicals ($CF_x$*) of the fluorocarbon in the plasma are supplied, as shown in FIG. 7C. As a result, a loss of the silicon nitride 102 is caused by ion energy.

Thus, in the removing process of the process S7, only the high frequency power for plasma formation from the first high frequency power supply 43 is applied to the upper electrode 36, and the high frequency bias power from the second high frequency power supply 44 is not applied to the lower electrode 18.

After the removing process of the process S7 is carried out as stated above, the processes S3 and S4 are repeated again. In this case, since the film thickness of the deposit DP has decreased as a result of performing the prior process S7, the first region R1 can be further etched if the substrate W is exposed to the plasma of the above-described processing gas by performing the process S3 again. Then, as the process S4 is performed, the first region R1 can be etched by the radicals of the fluorocarbon in the deposit DP.

In the process S6, if the film thickness of the deposit DP is less than the threshold value, the processes S3 and S4 are repeatedly performed again. In this case, since the film thickness of the deposit DP has decreased as a result of performing the prior process S4, the first region R1 can be further etched if the substrate W is exposed to the plasma of the above-described processing gas by performing the process S3 again. Then, as the process S4 is performed, the first region R1 can be etched by the radicals of the fluorocarbon in the deposit DP.

Moreover, in the process S7, the entire deposit DP need not be removed as long as a preset amount of the deposit DP can be reduced.

Experimental Examples

Below, various kinds of experimental examples conducted to evaluate the method MT will be discussed. The experimental examples to be described below are nothing more than examples, and do not limit the present disclosure.

FIG. 8 is a chart showing an example of the loss of the silicon nitride 102. A horizontal axis of FIG. 8 represents a slit depth of the silicon oxide 101 in a SAC process of FIG. 12 to be described later, and a vertical axis indicates the loss of the silicon nitride 102.

As compared to an etching method a (the comparative example shown in FIG. 1) in which the removing process is not performed, the loss of the silicon nitride 102 is found to be reduced in an etching method b (a comparative example) in which the removing process is performed by using a second processing gas including the oxygen gas. Further, as compared to the etching method b, the loss of the silicon nitride 102 is found to be further reduced in an etching method c in which the removing process is performed by using the second processing gas without containing the oxygen gas according to the method MT. As can be seen from the above results, in the removing process of the method MT, the loss of the silicon nitride 102 can be reduced by using the second processing gas which does not contain the oxygen gas.

Figure 9:
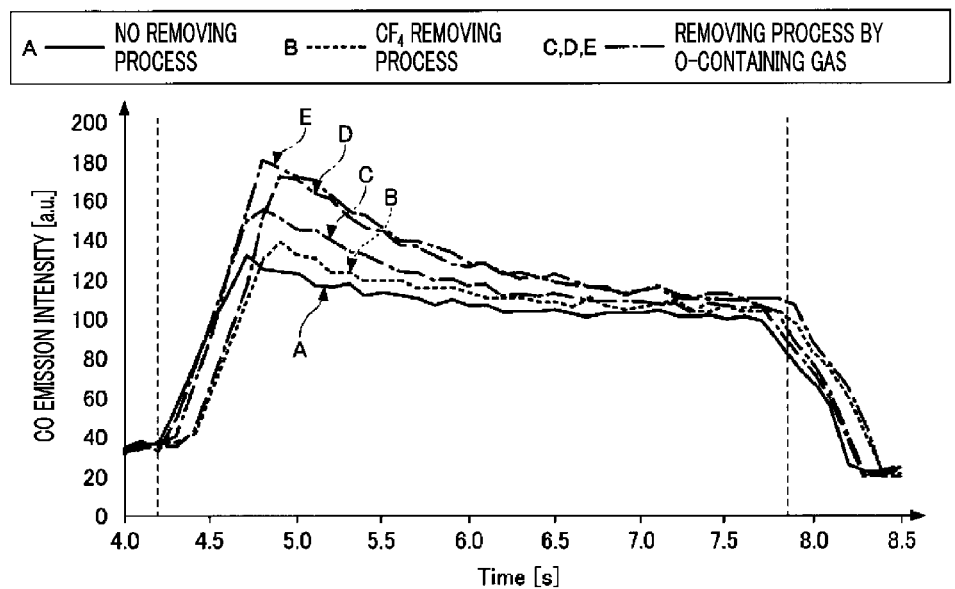
FIG. 9 is a diagram showing measurement results of CO emission intensity after the removing process of the method MT.

FIG. 9 is a diagram which provides a comparison of measurement results of a CO emission intensity in the etching (the processes S3 and S4 of FIG. 2) after the removing process (the process S7 of FIG. 2) according to the method MT with comparative examples. A horizontal axis of FIG. 9 indicates an etching time, and a vertical axis thereof represents the CO emission intensity.

An etching method B in which the removing process is performed by using the second processing gas including the $CF_4$ gas but not including the oxygen gas according to the method MT, an etching method A (the comparative example of FIG. 1) in which the removing process is not performed, and etching methods C to E (comparative examples) in which the removing process is performed by using O-containing gases are compared. As a result, in each of the etching methods C to E, since the O-containing gas is used, an unnecessary oxide film is formed, and the CO emission intensity increases. Meanwhile, in the etching method B in which the removing process is performed by using the $CF_4$ gas according to the method MT, since the gas without containing oxygen is used, an unnecessary film is not formed, and the CO emission intensity is as low as the CO emission intensity in the etching method A in which the removing process is not performed.

Figures 10A, 10B:
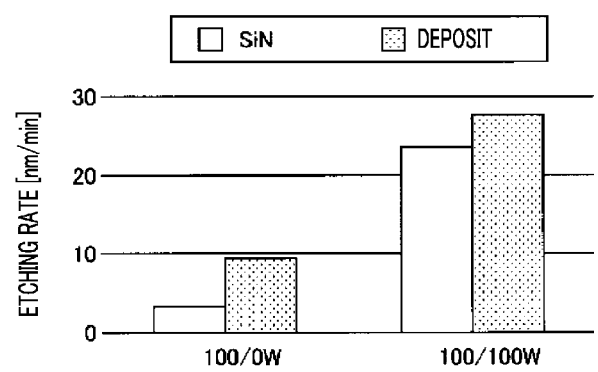
FIG. 10A and FIG. 10B are diagrams showing a relationship between presence or absence of a high frequency bias power and etching rates of silicon nitride and a deposit in the removing process.

FIG. 10A and FIG. 10B are diagrams showing a relationship between presence or absence of the high frequency bias power in the removing process and etching rates of the silicon nitride and the deposit DP. FIG. 10A shows etching rates of the silicon nitride 102 and the deposit DP when the high frequency power of 100 W for plasma formation is applied to the upper electrode 36 from the first high frequency power supply 43 whereas no high frequency bias power from the second high frequency power supply 44 is applied.

FIG. 10B shows etching rates of the silicon nitride 102 and the deposit DP when the high frequency power of 100 W for plasma formation is applied to the upper electrode 36 from the first high frequency power supply 43 and the high frequency bias power of 100 W is also applied from the second high frequency power supply 44.

According to this experiment, in the removing process of the method MT, if the high frequency bias power from the second high frequency power supply 44 is applied to the lower electrode 18, the loss of the silicon nitride 102 is caused due to the ion energy, though the etching rate of the deposit DP is improved. In contrast, if the high frequency bias power is not applied to the lower electrode 18, although the etching rate of the deposit DP gets low as compared to the case where the high frequency bias power is applied, the loss of the silicon nitride 102 can be suppressed.

FIG. 11A to FIG. 11C are diagrams illustrating a relationship between a processing time of the removing process and an etching rate of silicon oxide. FIG. 11A shows the etching rate of the silicon oxide 101 in an etching method (the comparative example shown in FIG. 1) in which the removing process is not performed, and FIG. 11B and FIG. 11C show the etching rates of the silicon oxide 101 in the method MT in which the removing process is performed. A processing time of the removing process of FIG. 11B is 5 seconds, and a processing time of the removing process of FIG. 11C is 30 seconds.

A horizontal axis of each graph of FIG. 11A to FIG. 11C indicates a position (a position on an X axis and a Y axis perpendicular to the X axis) of a substrate having a diameter of 300 mm. According to FIG. 11A to FIG. 11C, the etching rate of the silicon oxide 101 is found to be almost same as the etching rate in the case when the removing process is not performed, regardless of the length of the processing time of the removing process. That is, if the removing process is performed for at least 5 seconds, the silicon oxide film 101 can be etched at a required etching rate while avoiding the stop of the etching of the first region R1.

In the above-described method MT, the etching processings of the processes S3 and S4 of FIG. 2 are repeatedly performed. If, however, the film thickness of the deposit DP is found to be equal to or larger than the threshold value in the process S6, the process S7 of removing the deposit DP is performed, and, then, the etching processings of the processes S3 and S4 are performed again. Further, in the method MT, the processing gas does not include the oxygen gas in the removing process of the process S7. Accordingly, it is possible to etch the first region R1 selectively against the second region R2 while suppressing the stop of the etching of the silicon oxide 101 of the first region R1 and the oxidation of the silicon nitride 102 of the second region R2.

Modification Example

Now, a modification example of the above-described method MT will be explained. In the method MT, the etching processing of the process S3 and the etching processing of the process S4 are repeatedly performed in sequence. However, the etching processings of the processes S3 and S4 may be performed at the same time. In this case well, the removing process of the process S7 is performed if the film thickness of the deposit DP becomes equal to or larger than the threshold value in the process S6.

Further, in the method MT, the film thickness of the deposit DP is measured in real time by monitoring the surface state of the substrate W. However, the processings of the process S1 and the process S6 may be omitted. In this case, when the stop condition is not met after the etching processings of the processes S3 and S4 are performed, the removing process of the process S7 is performed.

[Other Processes]

Figure 12:
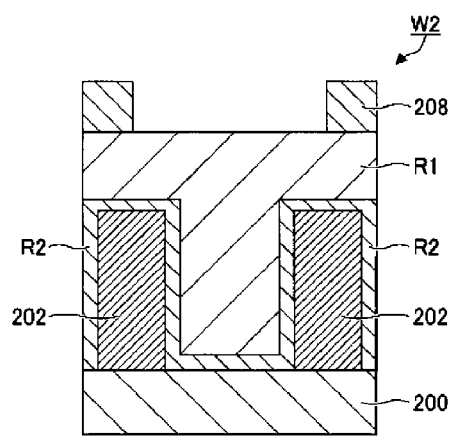
FIG. 12 is a cross sectional view illustrating another example etching target film of the method MT.

The method MT can be applied to etching of other types of target films. FIG. 12 is a cross sectional view illustrating another example of an etching target film of the method MT. FIG. 12 illustrates a substrate W2 having a first region R1 and a second region R2. The method MT can be applied to this substrate W2. To elaborate, the substrate W2 has a base layer 200, a plurality of protrusion regions 202, a first region R1, a second region R2 and a mask 208. The substrate W2 may be a product obtained in the course of manufacturing, by way of example, a fin type field effect transistor.

The base layer 200 may be made of, by way of non-limiting example, polycrystalline silicon. As an example, the base layer 200 is a fin region and has a substantially rectangular shape. The plurality of protrusion regions 202 are provided on the base layer 200 and arranged substantially in parallel to each other. These protrusion regions 202 may be, for example, gate regions. The second region R2 is formed of silicon nitride to cover the plurality of protrusion regions 202. Further, the protrusion regions 202 are embedded in the first region R1. That is, the first region R1 is formed to cover the protrusion regions 202 via the second region R2 therebetween. The first region R1 is made of silicon oxide. The mask 208 is provided on the first region R1. The mask 208 has a pattern with openings opened above regions between the adjacent protrusion regions 202. This mask 208 is made of an organic film. Further, the mask 208 may be produced by photolithography.

If the method MT is performed on the substrate W2, the first region R1 of the substrate W2 can be selectively etched against the second region R2. Therefore, holes can be formed in self-aligned manner in the regions between the neighboring protrusion regions 202. Further, the etching of the first region R1 can progress while a stop of the etching of the first region R1 is suppressed. Accordingly, the formed holes extend to a surface of the base layer 200 through the regions between the adjacent protrusion regions 202. These holes may be used as, for example, contact holes connected to a source or a drain of the fin region.

It should be noted that the etching method and the plasma processing apparatus according to the exemplary embodiments described above are illustrative in all aspects and are not anyway limiting. The above-described exemplary embodiments can be changed and modified in various ways without departing from the scope and the spirt of claims. Unless contradictory, other configurations may be adopted, and disclosures of the various exemplary embodiments can be combined appropriately.

The plasma processing apparatus of the present disclosure may be applicable to any of various types of apparatuses such as an atomic layer deposition (ALD) apparatus, a capacitively coupled plasma (CCP) apparatus, an inductively coupled plasma (ICP) apparatus, a radial line slot antenna (RLSA) apparatus, an electron cyclotron resonance plasma (ECR) apparatus and a helicon wave plasma (HWP) apparatus.

According to the exemplary embodiment, it is possible to etch the silicon oxide while preventing degradation of the silicon nitride.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. An apparatus for a plasma processing comprising a first electrode configured to place a substrate thereon within a chamber; a second electrode facing the first electrode; and a controller,
wherein the controller is configured to control:
preparing the substrate having a first region formed of silicon oxide and a second region formed of silicon nitride;
etching the first region by exposing the substrate to plasma of a first processing gas including a fluorocarbon gas, and forming a deposit including fluorocarbon on the first region and the second region;
etching the first region and the second region by radicals of the fluorocarbon included in the deposit; and
removing the deposit by plasma of a second processing gas which does not include oxygen,
wherein the controller is configured to apply a high frequency power to the second electrode but not to apply a high frequency power to the first electrode in the removing of the deposit, and
wherein the first processing gas is different from the second processing gas.

2. The apparatus of claim 1,
wherein the second processing gas includes a fluorine-containing gas.

3. The apparatus of claim 1,
wherein the second processing gas includes a $CF_4$ gas, a $NF_3$ gas, or a $SF_6$ gas.

4. The apparatus of claim 1,
wherein the second processing gas includes a $N_2$ gas.

5. The apparatus of claim 1,
wherein the etching of the first region and the etching of the first region and the second region are repeated.

6. The apparatus of claim 1,
wherein the etching of the first region and the etching of the first region and the second region are performed at the same time.

7. The apparatus of claim 1, further comprising:
monitoring a thickness of the deposit,
wherein the removing of the deposit is performed at a time when the thickness of the deposit monitored in the monitoring of the thickness of the deposit is equal to or larger than a preset threshold value.

* * * * *